(12) United States Patent
Matsuzawa

(10) Patent No.: US 6,881,531 B2
(45) Date of Patent: Apr. 19, 2005

(54) RESIST MATERIAL AND EXPOSURE METHOD

(75) Inventor: Nobuyuki Matsuzawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 66 days.

(21) Appl. No.: 10/317,685

(22) Filed: Dec. 12, 2002

(65) Prior Publication Data

US 2003/0118935 A1 Jun. 26, 2003

(30) Foreign Application Priority Data

Dec. 19, 2001 (JP) .................................. P2001-386306

(51) Int. Cl.$^7$ .............................................. G03F 7/004
(52) U.S. Cl. .................... 430/270.1; 430/325; 430/905; 430/907
(58) Field of Search .............................. 430/905, 270.1, 430/325, 907

(56) References Cited

FOREIGN PATENT DOCUMENTS

WO   wo 2002/090423   * 11/2002

OTHER PUBLICATIONS

WO 200290423, Nov. 2002 Derwent Abstract.*

* cited by examiner

*Primary Examiner*—Rosemary Ashton
(74) *Attorney, Agent, or Firm*—Robert J. Depke; Holland & Knight LLP

(57) ABSTRACT

An exposure method comprising a step of subjecting a resist layer to selective exposure to an ultraviolet light and forming a predetermined pattern in the resist layer, wherein a polymer material having introduced thereinto a cyclohexane group is used as a polymer material constituting the resist layer wherein all hydrogen atoms bonded to four continuously adjacent carbon atoms in the cyclohexane group are substituted by fluorine atoms. The use of a polymer material having a lowered absorption in the wavelength range of a vacuum ultraviolet (VUV) light in the resist material or resist layer enables a more improved ultra-fine processing than before.

23 Claims, 1 Drawing Sheet

RESIST MATERIAL AND EXPOSURE METHOD

CROSS REFERENCE TO RELATED APPLICATIONS

The present document is based on Japanese Priority Document JP2001-386306, filed in the Japanese Patent Office on Dec. 19, 2001, the entire contents of which being incorporated herein by reference.

BACKGROUND OF THE INVENTION

1. Field of the Invention

The present invention relates to a resist material and an exposure method which are used in microfabrication in, for example, the field of semiconductor.

2. Description of Related Art

In, for example, the field of semiconductor, as the degree of integration of semiconductor devices is increasing, an urgent task is to establish a new processing technique which enables processing of an ultra-fine pattern as small as, for example, 0.1 μm or less.

A so-called lithography technique is indispensable to processing of a fine pattern. For improving the optical resolution in the lithography technique by using a light for exposure having a shorter wavelength to apply the lithography technique to ultra-fine processing, the conventional lithography technique using a g-line or i-line from a mercury lamp or an ultraviolet light from a KrF (krypton-fluorine; wavelength: 248 nm) or ArF (argon-fluorine; wavelength: 193 nm) excimer laser has been applied to commercial use. These techniques have a restriction of resolution due to the wavelength of the used light so that they are applied to the devices according to the design rule of 0.13 μm or more.

On the other hand, another urgent task is to develop a new lithography technique which enables fabrication of devices according to the design rule 0.1 μm or less. Therefore, vigorous studies are being made on development of a new exposure technique using a vacuum ultraviolet (hereinafter, frequently referred to simply as "VUV") light having a wavelength of 170 nm or less, which is even shorter than the wavelength of a light source for exposure used in conventional lithography techniques. Specifically, as a substitute for ArF lithography which is a current lithography technique, a lithography technique using a $F_2$ (fluoride dimer) excimer laser (wavelength: 157 nm) as a light source is being developed. Further, a substitute for $F_2$ lithography, a lithography technique using an $Ar_2$ (argon dimer) excimer laser (wavelength: 126 nm) as a light source is proposed.

However, a general organic material conventionally used as a resist material in lithography has a problem in that it exhibits high optical absorption in the wavelength range of a VUV light, and thus the light radiated does not reach the bottom portion of the resist layer, so that a preferable rectangular resist pattern cannot be formed, causing deterioration of the resist pattern. Specifically, for example, a resin which is a main skeleton of the polymer constituting the resist material generally used, such as a novolak resin (for i-line lithography), a polyhydroxystyrene resin (for KrF lithography), or an acrylic resin (for ArF lithography), has a high optical absorption in the wavelength range of a VUV light. Therefore, these resins cannot be used as a resist material for VUV lithography.

In order to solve the problem of the resist pattern deterioration, a method has conventionally been employed in which thickness of a resist is reduced to about 70 nm or less to improve a collective transmittance of the resist layer. However this method poses problems in that the resist layer cannot exhibit a satisfactory etching resistance due to the small thickness of the resist, and that the small thickness of the resist causes the number of defects in the resist layer to increase.

Further, in order to solve the problem of the resist pattern deterioration, another method has been used. Specifically, there has been used a surface-imaging method utilizing silylation which enables formation of a pattern in the resist layer even when the resist layer has a low transmittance. However, the surface-imaging method has problems in that the resist pattern suffers an edge roughness, and that the dimensional control property is unsatisfactory.

SUMMARY OF THE INVENTION

In view of the above conventional problems, the present invention provides a resist material using a polymer material having a lowered optical absorption in the wavelength range of a VUV light. In addition, the present invention also provides an exposure method which uses the above resist material to enable a more improved ultra-fine processing than before.

The present invention is directed to a method for efficiently lowering the absorption in the wavelength range of a VUV light of an alicyclic hydrocarbon ring (hereinafter, frequently referred to as "alicyclic group") which serves as a group for securing a high etching resistance with more transparent tendency than that of an aromatic ring which serves also as a group for securing a high etching resistance. Particularly, the present invention is directed to a method for efficiently lowering the optical absorption in a case of a cyclohexane ring used as the alicyclic group (hereinafter, the cyclohexane ring is frequently referred to as "cyclohexane groups").

In an aspect of the present invention, there is provided a resist material comprising a polymer material having a cyclohexane group as an alicyclic group, wherein all hydrogen atoms bonded to four continuously adjacent carbon atoms in the cyclohexane group are substituted by fluorine atoms.

In addition, in another aspect of the present invention, there is provided an exposure method comprising a step of subjecting a resist layer to selective exposure to an ultraviolet light and forming a predetermined pattern in the resist layer, wherein a polymer material having introduced thereinto a cyclohexane group is used as a polymer material constituting the resist layer wherein all hydrogen atoms bonded to four continuously adjacent carbon atoms in the cyclohexane group are substituted by fluorine atoms.

In the present invention, by using a specific polymer material having a cyclohexane group in which all hydrogen atoms bonded to four continuously adjacent carbon atoms are substituted by fluorine atoms, a resist material having an alicyclic group which exhibits satisfactory transparency and having a lowered optical absorption in the wavelength range of a VUV light can be obtained while suppressing deterioration of the adhesion and etching resistance thereof. When performing an exposure using the above resist material to form a predetermined pattern in the resist material, a favorable rectangular resist pattern can be obtained.

The reason for this is described below. Generally, for securing a high etching resistance of a resist material, an aromatic ring or an alicyclic group is introduced into the polymer material constituting the resist material.

Specifically, a novolak resin for use in i-line lithography and a polyhydroxystyrene resin for use in KrF lithography individually have an aromatic ring. On the other hand, an acrylic resin for use in ArF lithography does not have an aromatic ring but an alicyclic group introduced thereinto since an aromatic ring has a large absorption at 193 nm which falls in the wavelength range of a light used for exposure in the ArF lithography. However, both the aromatic ring and the alicyclic group have a large optical absorption in the wavelength range of a VUV light, and therefore they cannot be incorporated as they are into a polymer material constituting the resist material to be used for VUV lithography.

On the other hand, it is known that an aromatic ring or an alicyclic group in which a hydrogen atom is substituted by a fluorine atom has a lower optical absorption in the wavelength range of a VUV light than that of an aromatic ring or alicyclic group having hydrogen atoms as such.

From a viewpoint of lowering of the optical absorption in the wavelength range of a VUV light, it is most desired that all hydrogen atoms contained in an aromatic ring or an alicyclic group are substituted by fluorine atoms. However, when a perfluorinated organic material is used in a resist layer, the resultant resist layer has extremely poor adhesion to the underlying silicon oxide film or organic or inorganic antireflection film, and thus, the perfluorinated organic material is unsuitable for use as a resist material.

In other words, from a viewpoint of prevention of lowering of the adhesion, it is desired that the rate of the hydrogen atoms in the aromatic ring or alicyclic group substituted by fluorine atoms is as small as possible.

Further, an organic material has a feature such that, the larger the rate of the hydrogen atoms in the organic material substituted by fluorine atoms, the poorer the etching resistance of the organic material. Therefore, also from the viewpoint of this, it is desired that the rate of the hydrogen atoms in the aromatic ring or alicyclic group substituted by fluorine atoms is as small as possible.

According to the present invention, the optical absorption of an alicyclic group in the wavelength range of a VUV light can be efficiently lowered with respect to the resist material or resist layer, so that favorable resist pattern can be obtained, thus enabling a more improved ultra-fine processing than before, for example, realizing processing of an ultra-fine pattern as small as 0.1 $\mu$m or less.

DESCRIPTION OF THE PREFERRED EMBODIMENT

Figure 1:
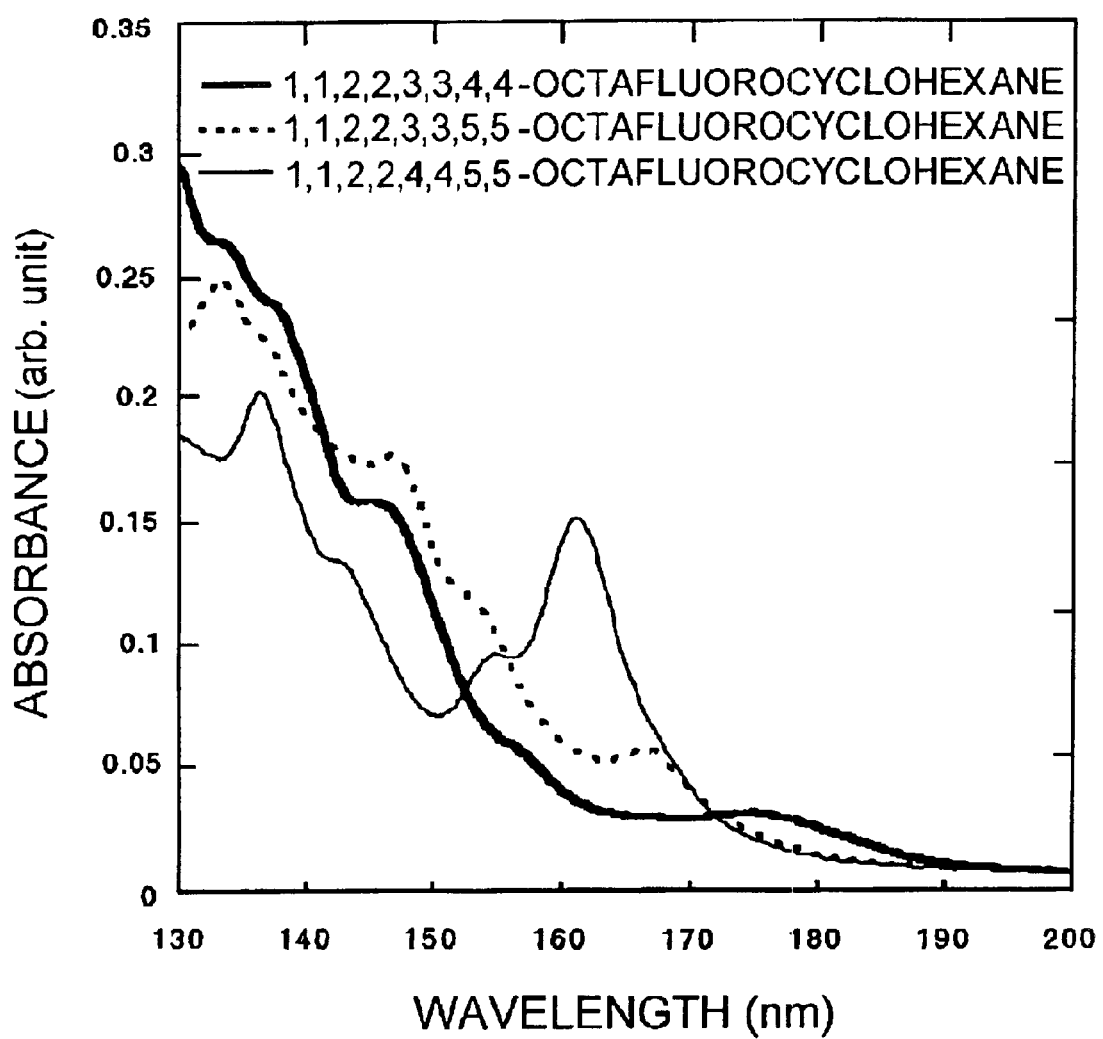
FIG. 1 is a graph showing the results of determination of absorption spectra in the wavelength range of a VUV light by making calculations using a density functional theory with respect to 1,1,2,2,3,3,4,4-octafluorocyclohexane, 1,1,2,2,3,3,5,5-octafluorocyclohexane, and 1,1,2,2,4,4,5,5-octafluorocyclohexane.

Hereinbelow, a resist material and an exposure method to which the present invention is applied will be described in detail with reference to the accompanying drawing.

The exposure method of the present invention may be applied to, for example, ultra-fine pattern processing for semiconductor devices. Specifically, the exposure method comprises the steps of: applying a photosensitive resist material onto a substrate to form a resist layer; subjecting the resist layer to selective exposure to a VUV light; and developing the resultant resist layer to form a predetermined pattern in the resist layer.

As a VUV light for exposure, a VUV light having an arbitrary wavelength can be used, but, especially by using a VUV light having a specific wavelength (110 to 170 nm), a resolution performance better than before can be obtained. Further, it is more preferred that the wavelength of the VUV light for exposure fall in the range of from 120 to 165 nm. Specifically, a VUV light having a wavelength of 157 nm emitted from a $F_2$ (fluoride dimer) excimer laser as a light source and a VUV light having a wavelength of 126 nm emitted from an $Ar_2$ (argon dimer) excimer laser as a light source can be used.

A polymer material used in the resist layer is, for example, a polymer material having a cyclohexane group, and the polymer material comprises, for example, at least one resin selected from the group consisting of a novolak resin having a cyclohexane group, a polyhydroxystyrene resin having a cyclohexane group, an acrylic resin having a cyclohexane group, a siloxane resin having a cyclohexane group, a silsesquioxane resin having a cyclohexane group, and a polycycloolefin resin having a cyclohexane group as a main skeleton.

In the present invention, as the cyclohexane group contained in the polymer material, a cyclohexane group is used wherein all hydrogen atoms bonded to four continuously adjacent carbon atoms in the cyclohexane group are substituted by fluorine atoms.

In the cyclohexane group, at least one hydrogen atom selected from the remaining hydrogen atoms unsubstituted may be substituted by a substituent other than a fluorine atom, for example, an alkyl group, a halogen atom other than a fluorine atom, an amino group, a nitro group, or a methylene group or a derivative thereof as long as the resist layer has a collective absorption coefficient of 5 $\mu m^{-1}$ or less at a wavelength of a VUV light used for the exposure. Further, when at least two hydrogen atoms selected from the remaining hydrogen atoms unsubstituted in the cyclohexane group are substituted by substituents other than a fluorine atom, the substituents may be either the same or different from each other. Further, the substituents may be bonded to one another.

As a polymer material used for the resist layer, a polymer material having the above-described cyclohexane group may be either solely used or, if desired, contain any one of or all of a photoacid generator for improving the exposure sensitivity, a dissolution inhibitor for improving the development properties, and a crosslinking agent for improving the resolution. These additives may be added to the polymer material in any proportions as long as the resist layer has a collective absorption coefficient of 5 $\mu m^{-1}$ or less at a wavelength of a VUV light used for the exposure. It is preferred that the additive is added to the polymer material used in the resist layer in an amount of 25% by weight or less, based on the weight of the polymer material. When the polymer material contains the additive(s) in an amount of more than 25% by weight, the collective resolution of the resultant resist material may be lowered.

The polymer material having the cyclohexane group may contain a group being capable of undergoing a chemical reaction due to light irradiation to exhibit favorable resolution, for example, an ester group, a phenolic hydroxyl group, an alcoholic hydroxyl group, a carboxyl group, a fluorinated ester group, a fluorinated-phenolic hydroxyl group, a fluorinated-alcoholic hydroxyl group, a fluorinated carboxyl group, or a group comprising a derivative of the above group. When the polymer material does not contain the above group, a proper resolution performance may be obtained by utilizing a chemical reaction of the cyclohexane group itself caused by light irradiation or a chemical reaction of the main skeleton of the polymer material caused by light irradiation.

In the present invention, a film comprised of a material other than silicon or silicon oxide, such as an organic or inorganic antireflection film or a hard mask, may be present between the resist layer and a substrate comprised of, e.g., silicon.

The resist layer may have a thickness of 70 nm or more, preferably 100 nm or more. When the resist layer has a thickness in the above range, the resist layer can secure a favorable etching resistance and advantageously suffers almost no defect. By using the resist material of the present invention, pattern formation in the resist layer having a thickness as small as less than 70 nm can be achieved. However there may be a possibility that, good etching cannot be performed due to the too small thickness of the resist layer in the etching step subsequent to the pattern forming step for the resist layer.

An explanation of the reason is made below why the fluorinated cyclohexane group according to the present invention is more transparent, as compared to the fluorinated cyclohexane group without any substitution for the hydrogen atom. As an example of the fluorinated cyclohexane group according to the present invention, 1,1,2,2,3,3,4,4-octafluorocyclohexane is taken, and, as examples of the fluorinated cyclohexane group without substitution, 1,1,2,2,3,3,5,5-octafluorocyclohexane and 1,1,2,2,4,4,5,5-octafluorocyclohexane are taken.

With respect to each of the above three types of molecules, their value of energies were delivered by theoretical calculation. In the calculation, geometry optimization of each of the molecular was first conducted using an ab initio molecular orbital method. Thus, the optimized geometry is obtained for each of the molecules. As the ab initio molecular orbital method, a Hartree-Fock method was used, and, as a basis function required for the calculation, a 6-31G* basis function (references: P. C. Hariharan, J. A. Pople, Theoret. Chim. Acta, 28, 1973, 213; and M. M. Francl, W. J. Petro, W. J. Herhre, J. S. Binkley, M. S. Gordon, D. J. DeFree, and J. A. Pople, J. Phys. Chem., 77, 1982, 3654) was used.

Utilizing the thus obtained optimized geometry molecular, absorption spectra of the respective molecules were theoretically determined by calculation using a density functional theory which is one of the ab initio molecular orbital methods. In the calculation using the density functional theory, the Vosko-Wilk-Nusair correlation potential (reference: S. H. Vosko, L. Wilk, and M. Nusair, Can, J. Phys., 58, 1980, 1200) was used. The basis function used is one that is obtained by adding the Rydberg basis function (reference: T. H. Dunning Jr., and P. J. Harrison, In Modern Theoretical Chemistry, Vol. 2, Ed.: H. F. Schaefer III, Plenum Press, New York, 1977) to the DZ basis function (reference: T. H. Dunning Jr., J. Chem. Phys., 53, 1970, 2823). In the calculation for the absorption spectra, a time-dependent density functional theory (references: R. Bauernschmitt, R. Ahlrichs, Chem. Phys. Lett., 256, 1996, 454; and M. E. Casida, C. Jamorski, K. C. Casida, and D. R. Salahub, J. Chem. Phys., 108, 1998, 4439) was used.

The calculation using a Hartree-Fock method and the density functional calculation were made individually using program Gaussian 98 (Gaussian 98, Revision A. 7, M. J. Frisch, G. W. Trucks, H. B. Schlegel, G. E. Scuseria, M. A. Robb, J. R. Cheeseman, V. G. Zakrzewski, J. A. Montogomery Jr., R. E. Stratmann, J. C. Burant, S. Dappich, J. M. Millam, A. D. Daniels, K. N. Kudin, M. C. Strain, O. Farkas, J. Tomasi, V. Barone, M. Cossi, R. Cammi, B. Mennucci, C. Pomelli, C. Adamo, S. Clifford, J. Ochterski, G. A. Petersson, P. Y. Ayala, Q. Cui, K. Morokuma, D. K. Malick, A. D. Rabuck, K. Raghavachari, J. B. Foresman, J. Cioslowski, J. V. Ortiz, A. G. Baboul, B. B. Stefanov, G. Liu, A. Liashenko, P. Piskorz, I. Komaromi, R. Gomperts, R. L. Martin, D. J. Fox, T. Keith, M. A. Al-Laham, C. Y. Peng, A. Nanayakkara, C. Gonzalez, M. Challacombe, P. M. W. Gill, B. Johnson, W. Chen, M. W. Wong, J. L. Andres, C. Gonzalez, M. Head-Gordon, E. S. Replogle, and J. A. People, Gaussian, Inc., Pittsburgh Pa., 1988). The computer used for calculations is a workstation (COMTEC Octane Workstation), manufactured by DAIKIN INDUSTRIES, Ltd., Japan.

With respect to 1,1,2,2,3,3,4,4-octafluorocyclohexane, 1,1,2,2,3,3,5,5-octafluorocyclohexane, and 1,1,2,2,4,4,5,5-octafluorocyclohexane, absorption spectra in the wavelength range of a VUV light are determined by actually making calculations using a density functional theory, and the results are shown in FIG. 1.

As can be seen in FIG. 1, 1,1,2,2,3,3,4,4-octafluorocyclohexane exhibited a lower absorption peak in the wavelength range of a VUV light, especially at a wavelength of around 150 to 160 nm, than those of 1,1,2,2,3,3,5,5-octafluorocyclohexane and 1,1,2,2,4,4,5,5-octafluorocyclohexane. From the results, it is found that, by substituting all hydrogen atoms bonded to four continuously adjacent carbon atoms in cyclohexane by fluorine atoms, the optical absorption of cyclohexane in the wavelength range of a VUV light can be considerably lowered.

Embodiment

Herein below, the present invention will be described with reference to the following embodiment based on experimental results.

With respect to 1,1,2,2,3,3,4,4-octafluorocyclohexane, 1,1,2,2,3,3,5,5-octafluorocyclohexane, and 1,1,2,2,4,4,5,5-octafluorocyclohexane, absorption spectra in the wavelength range of a VUV light were actually measured. In the measurement of absorption spectra, a measurement apparatus was fabricated by the inventor of the present invention, and the light source used was a deuterium lamp (30 W) and an $MgF_2$ lens was used as a light source optical system. As a spectroscope part, a concave-surface diffraction grating having 1,200 grooves/mm (with $MgF_2$ coating) was used. The reciprocal linear dispersion was about 4 nm, and the range of the wavelength for measurement was 125 to 300 nm. In the sample chamber kept under vacuum, a semi-double beam measurement was possible, and a window gas cell made of $MgF_2$ was disposed. A sample molecule gas having controlled temperature and pressure was introduced into the gas cell, where the measurement was carried out. The condenser mirror used was a toroidal mirror. The pressure of the vacuum section in the sample chamber was about $4 \times 10^{-5}$ Torr. As a detector, a photomultiplier, model 6199, manufactured by JASCO Corporation, Japan, was used.

As the results of measurement, the values of absorbance at a wavelength of 157 nm of 1,1,2,2,3,3,4,4-octafluorocyclohexane, 1,1,2,2,3,3,5,5-octafluorocyclohexane, and 1,1,2,2,4,4,5,5-octafluorocyclohexane are relatively shown in Table 1 below. In Table 1, the absorbance of 1,1,2,2,4,4,5, 5-octafluorocyclohexane is taken as 1 and used as a standard value.

TABLE 1

| | |
|---|---|
| 1,1,2,2,3,3,4,4-Octafluorocyclohexane | 0.4 |
| 1,1,2,2,3,3,5,5-Octafluorocyclohexane | 0.5 |
| 1,1,2,2,4,4,5,5-Octafluorocyclohexane | 1 |

As is apparent from Table 1, the absorbance of 1,1,2,2,3,3,4,4-octafluorocyclohexane included in the cyclohexane group according to the present invention is considerably lowered, as compared to 1,1,2,2,3,3,5,5-octafluorocyclohexane and 1,1,2,2,4,4,5,5-octafluorocyclohexane to which the present invention is not applied.

Specifically, by the present invention, the optical absorption of an alicyclic group in the wavelength range of a VUV light can be efficiently lowered with respect to the resist material or resist layer, thus making it possible to provide a resist material for use in a new process technique which enables, for example, processing of an ultra-fine pattern as small as 0.1 $\mu$m or less.

In the above embodiment, an explanation is made taking unsubstituted cyclohexane as an example of the cyclohexane group, but the cyclohexane group in the present invention is not limited to this, and, for example, other cyclohexane (monomethylcyclohexane) groups can be applied to the present invention. Namely, the present invention is not limited to the above descriptions, but can be appropriately changed as long as the effect aimed at by the present invention can be achieved.

What is claimed is:

1. A resist material comprising a polymer material having a cyclohexane group as an alicyclic group, wherein all hydrogen atoms bonded to four continuously adjacent carbon atoms in said cyclohexane group are substituted by fluorine atoms.

2. The resist material according to claim 1, wherein at least one hydrogen atom selected from the remaining hydrogen atoms unsubstituted in said cyclohexane group is substituted by a substituent group other than a fluorine atom.

3. The resist material according to claim 2, wherein at least two hydrogen atoms selected from the remaining hydrogen atoms unsubstituted in said cyclohexane group are substituted by substituent groups other than a fluorine atom.

4. The resist material according to claim 3, wherein said substituent groups are the same.

5. The resist material according to claim 3, wherein each of said substituent groups is either one of a metbylene group and a derivative thereof.

6. The resist material according to claim 3, wherein said substituent groups are different.

7. The resist material according to claim 3, wherein said substituent groups are bonded to each other.

8. The resist material according to claim 1, wherein said polymer material comprises at least one resin selected from the group consisting of a novolak resin, a polyhydroxystyrene resin, an acrylic resin, a siloxane resin, a silsesquioxane resin, and a polycycloolefin resin as a main skeleton.

9. The resist material according to claim 1, wherein said polymer material contains a group being capable of undergoing a chemical reaction due to light irradiation.

10. The resist material according to claim 1, wherein said resist material contains at least one selected from the group consisting of a photoacid generator, a dissolution inhibitor, and a crosslinking agent as an additive.

11. The resist material according to claim 10, wherein the content of said additive is 25% by weight or less.

12. The resist material according to claim 1, wherein said polymer material has an absorption coefficient of 5 $\mu$m$^{-1}$ or less at a wavelength of a vacuum ultraviolet (VUV) light.

13. The resist material according to claim 1, wherein said n resist material has an absorption coefficient of 5 $\mu$m$^{-1}$ or less at a wavelength of a vacuum ultraviolet (VUV) light.

14. An exposure method comprising a step of subjecting a resist layer to selective exposure to an ultraviolet light and forming a predetermined pattern in the resist layer, wherein a polymer material having introduced thereinto a cyclohexane group in which all hydrogen atoms bonded to four continuously adjacent carbon atoms are substituted by fluorine atoms as a polymer material constituting said resist layer.

15. The exposure method according to claim 14, wherein said polymer material comprises at least one resin selected from the group consisting of a novolak resin, a polyhydroxystyrene resin, an acrylic resin, a siloxane resin, a silsesquioxane resin, and a polycycloolefin resin as a main skeleton.

16. The exposure method according to claim 14, wherein said polymer material contains a group being capable of undergoing a chemical reaction due to light irradiation.

17. The exposure method according to claim 14, wherein said resist layer contains at least one selected from the group consisting of a photoacid generator, a dissolution inhibitor, and a crosslinking agent as an additive.

18. The exposure method according to claim 17, wherein a content of said additive is 25% by weight or less.

19. The exposure method according to claim 14, wherein said polymer material has an absorption coefficient of 5 $\mu$m$^{-1}$ or less at a wavelength of a vacuum ultraviolet (VUV) light.

20. The exposure method according to claim 14, wherein said resist layer has an absorption coefficient of 5 $\mu$m$^{-1}$ or less at a wavelength of a vacuum ultraviolet (VUV) light.

21. The exposure method according to claim 14, wherein a vacuum ultraviolet (VUV) light is used as said ultraviolet light.

22. The exposure method according to claim 21, wherein said vacuum ultraviolet (VUV) light has a wavelength of 110 to 170 nm.

23. The exposure method according to claim 21, wherein a fluoride dimer (F$_2$) excimer laser is used as a light source of said vacuum ultraviolet (VUV) light.

* * * * *